United States Patent
Iguchi et al.

(10) Patent No.: US 8,927,965 B2
(45) Date of Patent: Jan. 6, 2015

(54) LIGHT RECEIVING ELEMENT AND OPTICAL DEVICE

(71) Applicant: Sumitomo Electric Industries, Ltd., Osaka-shi (JP)

(72) Inventors: Yasuhiro Iguchi, Osaka (JP); Hiroshi Inada, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/830,433

(22) Filed: Mar. 14, 2013

(65) Prior Publication Data
US 2013/0334492 A1  Dec. 19, 2013

(30) Foreign Application Priority Data
Jun. 13, 2012  (JP) .................... 2012-134142

(51) Int. Cl.
  *H01L 31/00* (2006.01)
  *H01L 31/0352* (2006.01)
  *H01L 31/105* (2006.01)
  *H01L 31/109* (2006.01)
(52) U.S. Cl.
  CPC ...... *H01L 31/035236* (2013.01); *H01L 31/105* (2013.01); *H01L 31/109* (2013.01)
  USPC ........ 257/21; 257/431; 257/611; 257/615; 257/E31.02; 257/E31.021; 438/24; 438/56
(58) Field of Classification Search
  USPC ............... 257/14, 21, 431, 611, 615, E31.02, 257/E31.021; 438/24, 56
  See application file for complete search history.

(56) References Cited

U.S. PATENT DOCUMENTS

2011/0140082 A1* 6/2011 Iguchi et al. .................... 257/14

FOREIGN PATENT DOCUMENTS

JP    2010-288297 A    12/2010

\* cited by examiner

*Primary Examiner* — Su Kim
(74) *Attorney, Agent, or Firm* — Venable LLP; Michael A. Sartori; Tamatane J. Aga

(57) ABSTRACT

A light-receiving element includes a III-V group compound semiconductor substrate, a light-receiving layer having a type II multi-quantum well structure disposed on the substrate, and a type I wavelength region reduction means for reducing light in a wavelength region of type I absorption in the type II multi-quantum well structure disposed on a light incident surface or between the light incident surface and the light-receiving layer.

17 Claims, 11 Drawing Sheets

LIGHT RECEIVING ELEMENT AND OPTICAL DEVICE

BACKGROUND OF THE INVENTION

1. Field of the Invention

The present invention relates to a near-infrared to infrared light-receiving element and an optical device and more particularly to a light-receiving element having responsivity that depends moderately on the wavelength in a near-infrared to infrared region and an optical device including the light-receiving element.

2. Description of the Related Art

A near-infrared to infrared region corresponds to an absorption spectrum region relevant to living bodies, such as animals and plants, and the environment. Thus, a near-infrared light detector that contains a III-V group compound semiconductor in a light-receiving layer is under development. For example, Japanese Unexamined Patent Application Publication No. 2010-288297 discloses a planer type light-receiving element that includes an InGaAs/GaAsSb type II multi-quantum well (MQW) structure as a light-receiving layer. This planer type light-receiving element includes a diffusion concentration distribution control layer, which prevents a high concentration of impurities from spreading over a multi-quantum well structure and degrading crystallinity during the formation of a p-n junction or a pin structure in the multi-quantum well structure by selective diffusion.

Although the sensor having an InGaAs/GaAsSb type II multi-quantum well structure as a light-receiving layer has responsivity at a wavelength of up to approximately 2.5 μm, the responsivity fluctuates greatly with the wavelength. This is because the InGaAs/GaAsSb type II multi-quantum well structure undergoes a type I transition as well as a type II transition. The type I transition imparts high responsivity to the sensor at a wavelength in the range of 1 to 1.7 μm. The wavelength in the range of 1 to 1.7 μm is in a type I wavelength region.

In a type I transition resulting from light reception, an electron makes a transition from a valence band to a conduction band in the layer having the multi-quantum well structure. Both the conduction band energy and the valence band energy are higher in GaAsSb than in InGaAs. The energy difference (band gap) Eg between the conduction band energy and the valence band energy is 0.75 eV ($\lambda$=1.65 μm) for GaAsSb having a standard chemical composition or 0.74 eV ($\lambda$=1.67 μm) for InGaAs having a standard chemical composition. Thus, GaAsSb and InGaAs have substantially the same energy difference (band gap). This defines the upper limit of the type I wavelength region in the range of 1 to 1.7 μm.

In the InGaAs/GaAsSb type II multi-quantum well structure, upon light reception, an electron makes a transition from a layer having a higher valence band energy (GaAsSb layer) to a layer having a lower conduction band energy (InGaAs layer). A small transition energy difference allows responsivity to expand to a longer wavelength. However, since the transition occurs between adjacent layers, the transition probability is surely lower in the type II transition than in the type I transition. In this case, the type II transition probability is proportional to an overlap integral between the wave function of electrons confined in a quantum well in the InGaAs conduction band and the wave function of holes confined in a quantum well in the adjacent GaAsSb valence band. An overlap integral between the adjacent bands is lower than an integral in InGaAs or GaAsSb in the type I transition (an integral in the same layer).

As described above, light reception in the InGaAs/GaAsSb type II multi-quantum well structure causes both the type I transition and the type II transition, and light reception due to the type I transition has higher responsivity than light reception due to the type II transition. This phenomenon is inevitable in the InGaAs/GaAsSb type II multi-quantum well structure. Thus, responsivity at a wavelength in the range of 1 to 1.7 μm is much higher than responsivity at a longer wavelength.

Furthermore, as described above, in a planer type light-receiving element having an InGaAs diffusion concentration distribution control layer, the InGaAs layer receives light having a wavelength in the range of 1 to 1.7 μm. This further increases responsivity in the type I wavelength region as compared with responsivity in a longer-wavelength region. The present invention is not limited to planer type light-receiving elements and is also directed to light-receiving elements having a mesa structure.

The phenomenon in a planer type light-receiving element that includes the InGaAs/GaAsSb type II multi-quantum well structure as a light-receiving layer will be described in detail below. Because of the phenomenon, the short-wavelength region of 1.7 μm or less and the long-wavelength region of more than 1.7 μm have different responsivities. The short-wavelength region of 1.7 μm or less has a mountain-shaped responsivity characteristic with a peak responsivity at a wavelength of approximately 1.5 μm. Responsivity at a wavelength of approximately 1.5 μm is approximately twice and much higher than responsivity in the long-wavelength region at a wavelength of 2 μm.

A sensor including a light-receiving element having such a type II multi-quantum well structure as a light-receiving layer has the following problem. Signals of the sensor are amplified, for example, in an amplifier circuit before output. When responsivity fluctuates greatly in the target wavelength region, the gain must be optimized in accordance with the wavelength region. However, this is practically difficult. From a practical standpoint, a light-receiving element having considerable fluctuations in responsivity cannot be used in a detector for spectroscopic analysis.

SUMMARY OF THE INVENTION

Accordingly, it is an object of the present invention to provide a light-receiving element that includes a light-receiving layer having a type II multi-quantum well structure and that has small fluctuations in responsivity throughout the target wavelength region, including a wavelength region of type I absorption. The present invention also provides an optical device including the light-receiving element.

A light-receiving element according to one aspect of the present invention includes a light-receiving layer having a type II multi-quantum well structure disposed on a III-V group compound semiconductor substrate. The light-receiving element includes a type I wavelength region reduction means for greatly reducing light in a wavelength region of type I absorption in the type II multi-quantum well structure as compared with light in a long-wavelength region, wherein the type I wavelength region reduction means is closer to a light incident surface than the light-receiving layer. The light-receiving element may have a single pixel or one- or two-dimensionally arranged pixels. Each of the pixels includes the light-receiving layer and reads signals produced upon light reception from each region.

In the absence of the type I wavelength region reduction means, responsivity in the type I wavelength region is excessively higher than responsivity in a longer-wavelength region.

The type I wavelength region reduction means can make responsivity substantially uniform in both of the wavelength regions. In existing light-receiving elements, the electrical output in the type I wavelength region is higher than its saturation level, for example, in a read-out integrated circuit. Thus, there is no room to increase gain. In the present invention, however, the type I wavelength region reduction means can make responsivity substantially uniform throughout the target wavelength region (reduce responsivity in the type I wavelength region), thereby making room to increase gain. Thus, responsivity in the target wavelength region including a region containing wavelengths that are longer than those of the type I wavelength region can be increased by means of gain control in the read-out integrated circuit.

The type I wavelength region reduction means may have any structure (material, thickness, and the like) with which light quantity or light flux in the type I wavelength region can be reduced by several tens of percent (for example, 25% to 75%). For example, the rate of absorption is in the range of 25% to 75%, and the transmittance is in the range of 75% to 25%.

The type I wavelength region reduction means does not significantly reduce light illuminance in a region containing wavelengths that are longer than those of the type I wavelength region or reduce light illuminance in the longer-wavelength region by less than half the reduction rate in the type I wavelength region.

The region containing wavelengths that are longer than those of the type I wavelength region includes light in a wavelength region that is received only through type II transition (a type II wavelength region).

The light incident surface may be disposed on the front or back side of a semiconductor (for example, a semiconductor substrate or an epitaxial layer). In such a case, an anti-reflection film (AR film) is generally disposed on the semiconductor, and the surface of the anti-reflection film is the light incident surface in a narrow sense. The surface of the type I wavelength region reduction means may be the light incident surface. The incident surface should be interpreted without departing from the gist of the present invention and without adherence to the wording.

The type I wavelength region reduction means may be an epitaxial semiconductor absorption layer for absorbing light in the type I wavelength region.

For example, one of a pair of layers constituting the type II multi-quantum well structure may serve as the absorption layer after its thickness is adjusted. Excessively high responsivity for light in the type I wavelength region causes a problem. The layer can absorb light in the type I wavelength region on the incident surface of the light-receiving layer through a type I transition. Of course, the layer is an epitaxial layer lattice-matched to the III-V group compound semiconductor substrate. In this case, light in the region containing wavelengths that are longer than those of the type I wavelength region has lower energy than the band gap of the absorption layer and is not absorbed by the absorption layer.

The absorption layer may be a monolayer film or a multi-layer film. In the light-receiving element including the light-receiving layer having the type II multi-quantum well structure, one of the pair of layers corresponds to the III-V group compound semiconductor that can absorb light in the type I wavelength region and little light in the region containing wavelengths that are longer than those of the type I wavelength region. Thus, a monolayer film of the III-V group compound semiconductor can be suitably used by adjusting its thickness.

The absorption layer is preferably separated from the light-receiving layer by 50% or more of the hole diffusion length.

In the case that a pixel electrode is a positive electrode, holes of hole-electron pairs generated by absorption in the absorption layer diffuse toward the light-receiving layer side of the pixel in response to an electric field. If the holes enter the light-receiving layer, the holes are recognized as holes generated in the light-receiving layer upon light reception. This results in nonuniform responsivity throughout the target wavelength region, and the absorption layer exacerbates the imbalance in responsivity. As described above, when the absorption layer is separated from the light-receiving layer by 50% or more of the hole diffusion length, more preferably by the diffusion length or more, most of the holes disappear and do not enter the light-receiving layer. This can make responsivity substantially uniform throughout the target wavelength region.

It is difficult even for holes properly generated in a depletion layer of the light-receiving layer upon light reception to make a transition from the valence band of the multi-quantum well structure to the pixel electrode. A number of holes disappear on the way to the pixel electrode. Thus, the absorption layer may be separated from the light-receiving layer by substantially 50% or more of the hole diffusion length.

The absorption layer may be an InGaAs layer or an InGaAsP layer.

Having a practical thickness so as to absorb several tens of percent of light in the type I wavelength region, the absorption layer absorbs little light in the longer-wavelength region. Furthermore, the absorption layer is lattice-matched to a substrate, such as an InP substrate, and can contribute to the formation of a good crystalline epitaxial layered body.

As described above, the absorption layer is suitably formed of a material of one of a pair of layers constituting the type II multi-quantum well structure, for example, InGaAs or InGaAsP. Although GaAsSb has appropriate band gap energy, GaAsSb is not very suitable because of surfactant effects of antimony (Sb). However, GaAsSb may also be used.

A light-receiving element according to one aspect of the present invention may further include a hole-extinguishing layer between the absorption layer and the light-receiving layer, wherein the absorption layer is disposed between the substrate and the light-receiving layer, and the hole-extinguishing layer has a thickness of 50% or more of the hole diffusion length and contains a III-V group compound semiconductor.

The hole-extinguishing layer can prevent holes generated in the absorption layer from entering the light-receiving layer and being counted as light reception. The hole-extinguishing layer may have a thickness of 50% or more of the hole diffusion length, preferably equal to or greater than the hole diffusion length.

The hole-extinguishing layer is preferably composed of an InP layer and/or an AlInAs layer.

This can realize satisfactory lattice matching and a good crystalline epitaxial layered body including a layer for extinguishing holes.

The type I wavelength region reduction means may be a coating film on the light incident surface. The coating film can make transmittance in the type I wavelength region lower than transmittance in the region containing wavelengths that are longer than those of the type I wavelength region.

This can make responsivity in the type I wavelength region and the region containing wavelengths that are longer than those of the type I wavelength region substantially uniform. The coating layer is a nonepitaxial layer.

The coating film may be a dielectric multi-layer film.

A multi-layer film of silicon oxide ($SiO_2$), silicon nitride (SiN), or silicon oxynitride (SiON) can be used to easily design desired wavelength dependence of transmittance. In particular, a less damaged dielectric multi-layer film having a low stress of 500 MPa or less can be formed by plasma chemical vapor deposition (CVD) using silicon oxide ($SiO_2$) and silicon oxynitride (SiON).

The substrate may be an InP substrate, and the light-receiving layer may have an InGaAs/GaAsSb type II multi-quantum well structure or a GaInNAs/GaAsSb type II multi-quantum well structure.

This results in an infrared light-receiving element having substantially constant wavelength dependence of responsivity in a wavelength region of up to approximately 2.5 µm.

A light-receiving element according to one aspect of the present invention preferably includes a ground electrode in contact with the absorption layer or the hole-extinguishing layer, wherein the InP substrate is doped with Fe or undoped.

The InP substrate doped with Fe or undoped can have improved transparency in a region containing wavelengths that are longer than those of the type I wavelength region. Since the substrate has a much larger thickness than the epitaxial layer, the improved transparency of the substrate is valuable in order to improve responsivity in the longer-wavelength region. The InP substrate doped with Fe or undoped can also have improved transparency in the type I wavelength region. However, since the InP substrate doped with Fe or undoped is semi-insulated, it is difficult to bring the InP substrate into ohmic contact with the ground electrode. Thus, the ground electrode may be in ohmic contact with an absorption layer or a hole-extinguishing layer doped with a high concentration of impurities.

When the ratio A of responsivity in the region containing wavelengths that are longer than those of the type I wavelength region to responsivity in the type I wavelength region in the light-receiving layer is less than 1, the material and the thickness of the absorption layer or the coating film may be determined such that the ratio of light transmittance in the type I wavelength region to light transmittance in the region containing wavelengths that are longer than those of the type I wavelength region is 0.8 A or more and 1.2 A or less.

This can make responsivity in the target wavelength region substantially uniform within the range of approximately ±20%.

When the type I wavelength region has a representative wavelength of 1.5 µm, the region containing wavelengths that are longer than those of the type I wavelength region has a representative wavelength of 2.1 µm, and the ratio A of responsivity in the wavelength of 2.1 µm to responsivity in the wavelength of 1.5 µm is less than 1, then the material and the thickness of the absorption layer or the coating film may be determined such that the ratio of transmittance at a wavelength of 1.5 µm to transmittance at a wavelength of 2.1 µm is 0.8 A or more and 1.2 A or less.

This can make responsivity substantially uniform throughout the target wavelength region, for example, from a wavelength of approximately 1.0 µm to a wavelength of approximately 2.5 µm in a near-infrared region. This can improve responsivity to a light in a wavelength region of more than 1.8 µm and realize a hyperspectral imaging system for identifying an organic substance, such as a minor protein. This also facilitates spectral output correction and partial least squares (PLS) in hyperspectral imaging using a wavelength region in the range of 1.0 to 2.5 µm.

The absorption layer or the coating film may be disposed on the back side of the substrate.

In the case of the absorption layer, since the substrate has a thickness equal to or greater than the hole diffusion length, the hole-extinguishing layer may be omitted. The hole diffusion length is approximately 1.6 µm, and the substrate is twenty or thirty or more times as thick as the hole diffusion length.

As described above, the absorption layer may be a mono-layer film or a multi-layer film. When the absorption layer is disposed on the back side of the substrate, it is easy to form the absorption layer of a multi-layer film because it takes no notice of epitaxial growth.

When the coating film is disposed on the back side of the substrate, the coating layer can advantageously be formed in the final process without significantly changing the manufacturing procedures for the main body of the light-receiving element. A manufactured light-receiving element may also be covered with a coating film.

An optical device according to one aspect of the present invention includes one of the light-receiving elements described above.

This allows a high-precision optical device to be manufactured using a light-receiving element having small fluctuations in responsivity throughout the target wavelength region.

The present invention can provide a light-receiving element that includes a light-receiving layer having a type II multi-quantum well structure and that has small fluctuations in responsivity throughout the target wavelength region, including a wavelength region of type I absorption.

DESCRIPTION OF THE PREFERRED EMBODIMENTS

First Embodiment

Figure 1:
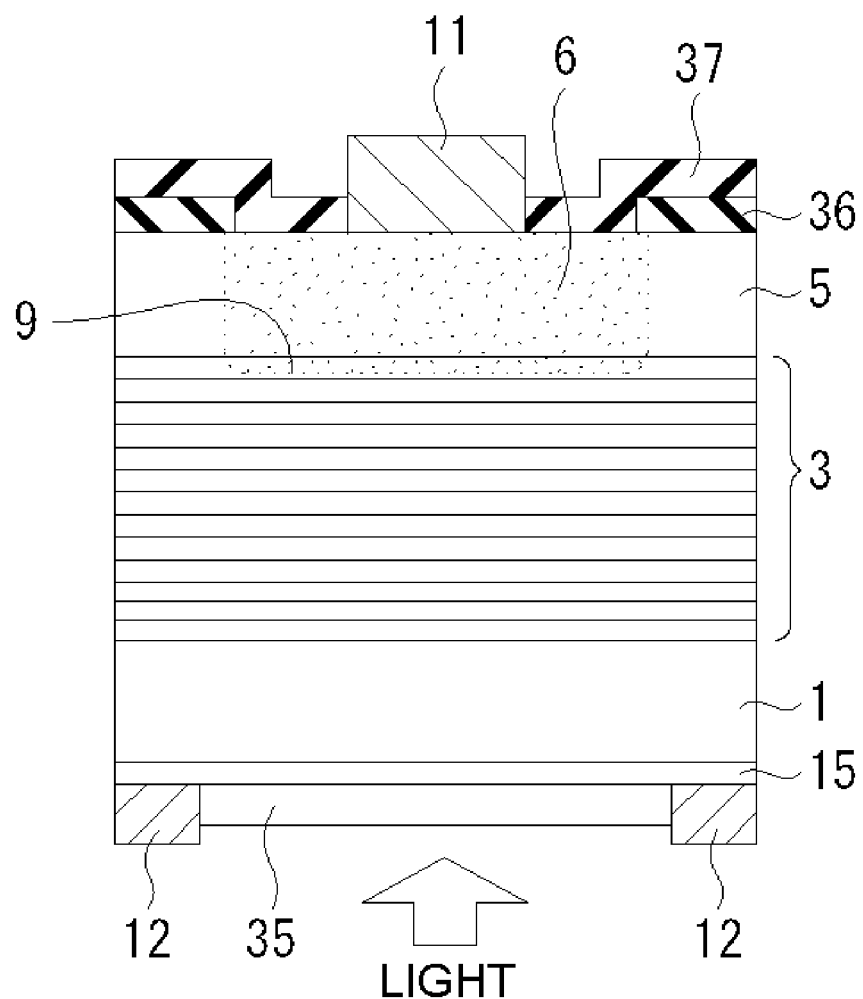
FIG. 1 is a schematic view of a light-receiving element according to a first embodiment of the present invention.

FIG. 1 is a schematic view of a light-receiving element 10 according to a first embodiment of the present invention. Although FIG. 1 illustrates a single pixel, the single pixel may be or even should be one of one- or two-dimensionally arranged pixels. More specifically, FIG. 1 illustrates a light-receiving element 10 having a single pixel or part of a light-receiving element 10 having one- or two-dimensionally arranged pixels. This applies to all the light-receiving elements according to the subsequent embodiments and will not be further described.

The following is an epitaxial layered structure of a III-V group compound semiconductor in the light-receiving element 10.

n-type InGaAs absorption layer 15/sulfur (S)-doped n-type InP substrate 1/light-receiving layer 3 having (InGaAs/GaAsSb) type II multi-quantum well structure/InP window layer 5

The light-receiving layer 3 has a multi-quantum well structure. The term "light-receiving layer 3" and "multi-quantum well structure 3" are therefore interchangeable. InP substrates having different electrical conductivities have the same reference numeral "1".

The type II multi-quantum well structure 3 includes 250 InGaAs (5 nm)-GaAsSb (5 nm) pairs and has a total thickness of 2.5 µm. The InP window layer 5 has a thickness of 0.6 µm. The thickness of the InGaAs absorption layer 15 will be described in detail below with reference to FIG. 4.

The InP window layer 5 includes a p-type region 6 made of zinc (Zn) selectively diffused through an opening of a selective diffusion mask pattern 36. The p-type region 6 is formed by the selective diffusion of zinc from the InP window layer 5 into the light-receiving layer 3. A pixel electrode 11 serving as a positive electrode in ohmic contact with the p-type region 6 is surrounded by a SiN passivation film 37. The SiN passivation film 37 also covers the selective diffusion mask pattern 36. A ground electrode 12 serving as a negative electrode in ohmic contact with the n-type InGaAs absorption layer 15 is disposed on the back side of the n-type InP substrate 1. Preferably, the positive electrode is made of AuZn, and the p-type carrier concentration of the p-type region 6 in contact with the positive electrode is $1E18$ cm$^{-3}$ or more. Preferably, the negative electrode is made of AuGeNi, and the n-type carrier concentration of the n-type InGaAs absorption layer 15 in contact with the negative electrode is also $1E18$ cm$^{-3}$ or more.

The n-type InP substrate 1 is a sulfur (S)-doped InP (100) substrate. Light enters the back side of the InP substrate 1. Thus, an anti-reflection (AR) film 35 is disposed on the n-type InGaAs absorption layer 15 disposed on the back side of the n-type InP substrate 1.

During light reception, a reverse bias voltage is applied to the p-n junction 9, that is, a voltage is applied between the pixel electrode 11 and the ground electrode 12 such that the ground electrode 12 has a higher electric potential than the pixel electrode 11. A depletion layer extends in the light-receiving layer 3 having a type II multi-quantum well structure. Light reaching the depletion layer induces the formation of electron-hole pairs. Since the pixel electrode 11 has a lower electric potential than the ground electrode 12, electromagnetic force acts on holes such that the holes are collected at the pixel electrode 11. The amount of electric charge of the holes read by a read-out integrated circuit (ROIC) gives information on light reception at the pixel. The read-out integrated circuit can read the amount of electric charge of the pixel at predetermined time intervals, thereby forming an image or the strength distribution of measured signals.

The p-n junction should be broadly interpreted as described below. A region of the light-receiving layer 3 between the p-n junction 9 and the substrate (most of the light-receiving layer) may be an impurity region (i region), the impurity concentration of which is low enough to consider the region to be an intrinsic semiconductor. Thus, the p-n junction may be p-i junction or n-i junction, and the p-i junction or the n-i junction may have a very low p-type impurity concentration or n-type impurity concentration. This applies to not only the case that the p-n junction is formed by selective diffusion but also the case that the p-n junction is formed by doping as described in the subsequent embodiment.

The light-receiving element 10 includes the light-receiving layer 3 having a type II multi-quantum well structure (InGaAs/GaAsSb). Without any measures, as indicated by a thick solid line in FIG. 2, the type II multi-quantum well structure (InGaAs/GaAsSb) includes two wavelength regions: a type I wavelength region having a wavelength of 1.7 µm or less and a long-wavelength region having a wavelength of more than 1.7 µm. The type I wavelength region has a peak responsivity at a wavelength of approximately 1.5 µm. The responsivity at a wavelength of approximately 1.5 µm is approximately twice the responsivity at a wavelength of 2 µm.

Figure 3:
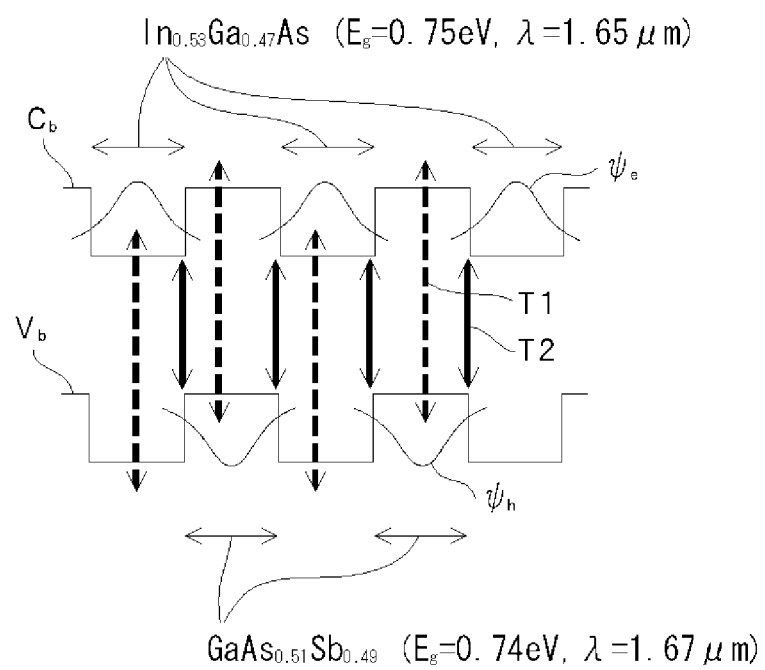
FIG. 3 is an explanatory view of type I and type II transitions in a light-receiving layer having a type II multi-quantum well structure.

This is because, as illustrated in FIG. 3, an overlap integral between the wave function of electrons ψe in InGaAs and the wave function of holes ψh in GaAsSb of the multi-quantum well structure is low because of their different positions. As illustrated in FIG. 3, a type II transition (absorption) T2 occurs between a GaAsSb layer and an InGaAs layer adjacent to each other. On the other hand, a type I transition T1 occurs in the same layer and therefore has a higher overlap integral than the type II transition T2. Thus, the type I transition T1 absorption is much larger than the type II transition T2 absorption. The transitions T1 and T2 in FIG. 3 occur between band ends and represent the minimum energy difference between the states in each of the transitions T1 and T2 or the maximum wavelength. Light having a wavelength of 2.5 µm or less can cause the type II transition T2. Likewise, light having a wavelength of approximately 1.7 µm or less can cause the type I transition T1.

In a sensor including a light-receiving element, sensor signals are amplified, for example, in an amplifier circuit before output. When responsivity fluctuates greatly in the target wavelength region, the gain must be optimized in accordance with the wavelength region. However, this is practically difficult. Thus, a light-receiving element having considerable fluctuations in responsivity depending on the wavelength region cannot be used in a detector for spectroscopic analysis. An increase in gain in proportion to responsivity in the wavelength region having a wavelength of more than 1.7 µm results in saturated output at a wavelength of approximately 1.5 µm. In contrast, a decrease in gain in proportion to responsivity at a wavelength of 1.7 µm or less results in low output in the wavelength region having a wavelength of more than 1.7 µm.

<Features of the Invention>

The present invention has the following features. The n-type InGaAs absorption layer 15 is disposed on the back side of the n-type InP substrate 1. The absorption layer 15 is not necessarily one of a pair of layers constituting the type II multi-quantum well structure, provided that the absorption layer 15 is made of a III-V group compound semiconductor having an absorption band in the type I wavelength region and satisfying lattice matching conditions. However, the absorption layer 15 composed of one of a pair of layers constituting the type II multi-quantum well structure can properly absorb light in the wavelength region having fluctuations in responsivity only by optimizing the thickness of the layer. Since the layer itself causes fluctuations in responsivity in the target wavelength region, light in the wavelength region can be properly absorbed.

With respect to lattice matching in the light-receiving element 10 illustrated in FIG. 1, only the AR film 35 is disposed on the absorption layer 15 on the back side of the InP substrate 1, and no epitaxial layer is formed on the absorption layer 15. Thus, lattice matching is not significantly important. Nevertheless, since the ground electrode 12 is disposed on the absorption layer 15, the absorption layer 15 is preferably lattice-matched to the n-type InP substrate 1 because this can reduce the external voltage required for the application of a bias voltage.

Figure 4:
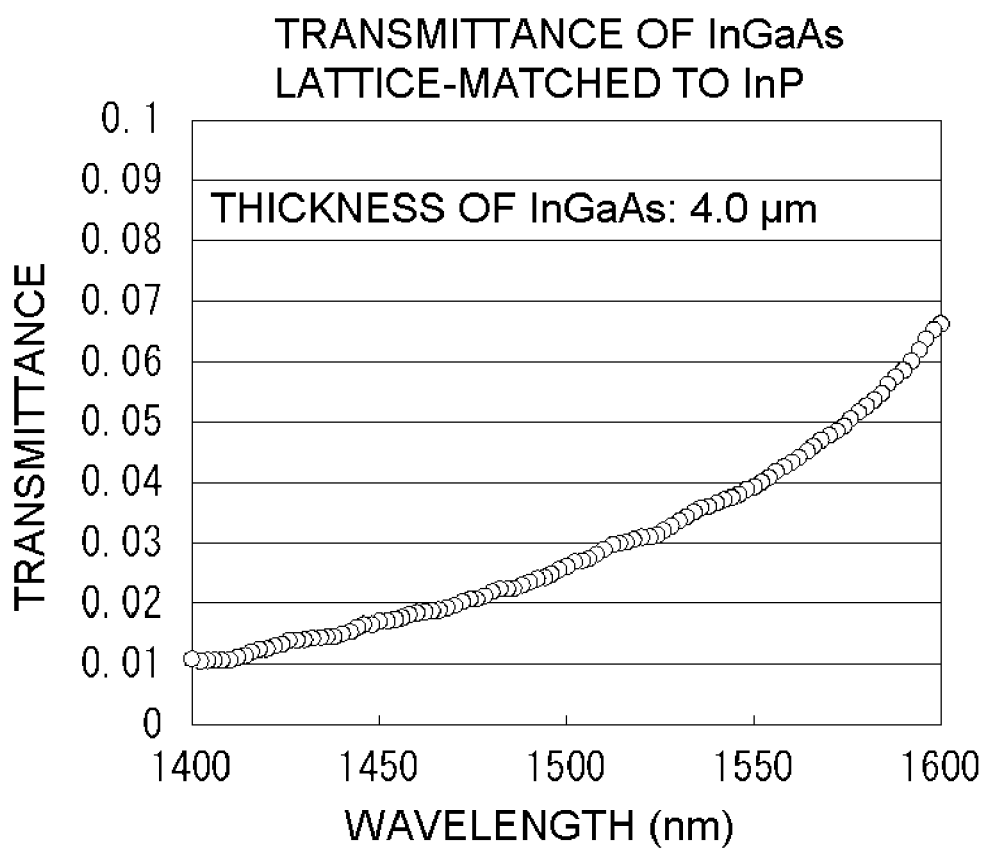
FIG. 4 is a graph of the transmittance of an InGaAs absorption layer having a thickness of 4.0 µm, which is used to determine the thickness of the InGaAs absorption layer.

The degree of absorption depends on the material and the thickness of the absorption layer 15. The material is described above. The thickness is determined as described below. FIG. 4 is a graph of the transmittance of an InGaAs layer having a thickness of 4.0 µm, which is lattice-matched to InP. 100% transmittance is taken as a transmittance of 1 on the vertical axis. A transmittance of 0.1 on the vertical axis corresponds to 10% transmittance. In accordance with FIG. 4, the transmittance at a wavelength of 1.5 µm is 0.0264 (2.64%). Substitution of a thickness $t=4E-4$ cm and $(P/Po)=0.0264$ into an equation (1): $(P/Po)=\exp(-\alpha t)$, wherein $\alpha$ denotes absorption coefficient ($cm^{-1}$), t denotes thickness (cm), and (P/Po) denotes transmittance, yields $\alpha=9086$ $cm^{-1}$ at a wavelength of 1.5 µm. In order to reduce the quantity (flux) of light having a wavelength of 1.7 µm or less or light in the type I wavelength region before light enters the light-receiving layer 3 to 40% to 60% of the light quantity on the incident surface, the thickness of the absorption layer 15 can be calculated using $\alpha=9086$ $cm^{-1}$ in the equation (1). Although the absorption coefficient $\alpha$ is not constant throughout the type I wavelength region having a wavelength of 1.7 µm or less in the strict sense, the absorption coefficient $\alpha$ at a wavelength of 1.5 µm may be used for approximate calculation. For 40% transmittance, $0.4=\exp(-9086t)$ yields the thickness $t=1.0$ µm. For 60% transmittance, $0.6=\exp(-9086t)$ yields the thickness $t=0.56$ µm. Thus, when the thickness t of the InGaAs absorption layer 15 is 0.56 µm or more and 1.0 µm or less, the light quantity in the type I wavelength region before light enters the light-receiving layer 3 can be reduced by 40% or more and 60% or less of the light quantity on the incident surface.

There is one point to be paid attention to. Light absorption in the absorption layer generates hole-electron pairs as described above, and holes drift toward the light-receiving layer 3 in the presence of a reverse bias voltage. If holes generated in the InGaAs absorption layer 15 enter the light-receiving layer 3, the holes are counted as light reception in the light-receiving layer 3, although light is absorbed in the InGaAs absorption layer 15. Such holes read by a read-out integrated circuit may increase responsivity in the type I wavelength region but do not reduce the responsivity. This is contrary to the intention. In order to prevent holes generated in the absorption layer 15 from being counted in the light-receiving layer 3, the absorption layer 15 may be separated from the light-receiving layer 3 by substantially 50% of the hole diffusion length or by the hole diffusion length.

In the present embodiment, the InP substrate 1 that is several tens to several hundreds times as thick as the hole diffusion length is disposed between the InGaAs absorption layer 15 and the light-receiving layer 3. Thus, the conditions described above are satisfied without any measures.

Figure 2:
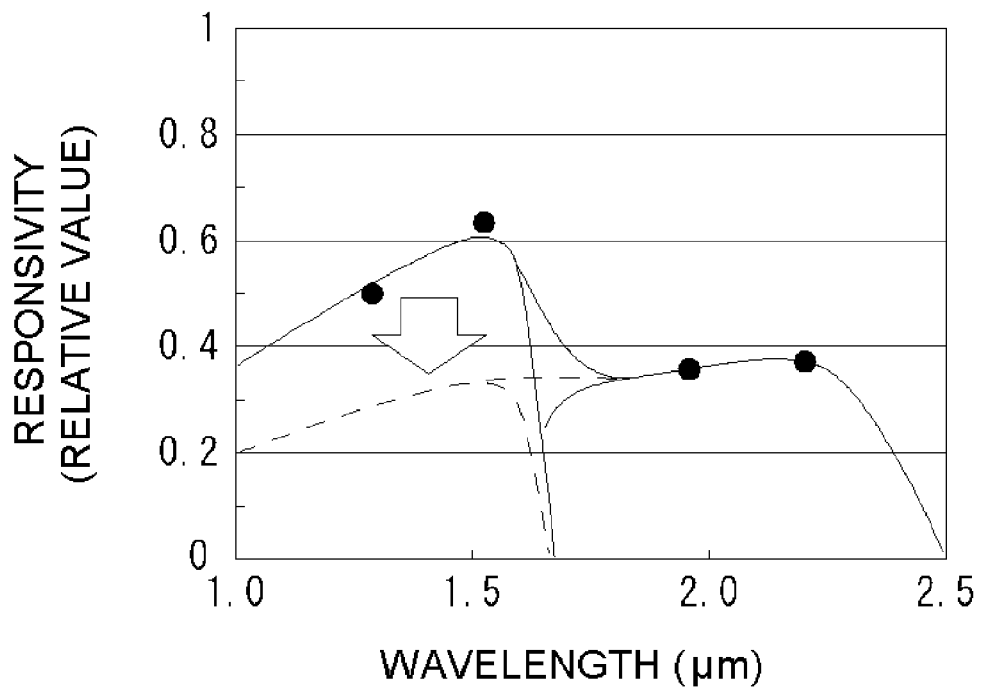
FIG. 2 is a graph of the wavelength dependence of responsivity of the light-receiving element illustrated in FIG. 1, compared with an existing light-receiving element.

As shown in FIG. 2, the InGaAs absorption layer 15 reduces responsivity in the type I wavelength region as indicated by the broken line, making the responsivity substantially the same as the responsivity in the region containing wavelengths that are longer than those of the type I wavelength region. Thus, the light-receiving element 10 can be used in a detector for spectroscopic analysis. This makes room to increase gain throughout the target wavelength region. Thus, responsivity in the target wavelength region including a region containing wavelengths that are longer than those of the type I wavelength region can be increased by means of gain control in the read-out integrated circuit. This applies to all the embodiments, including the present embodiment. This will be further described below with reference to FIG. 10 (the fifth embodiment).

Figure 5:
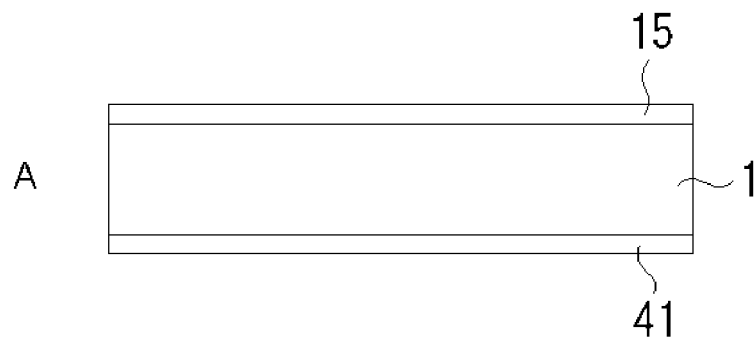
FIG. 5A is a schematic view illustrating a method for manufacturing the light-receiving element illustrated in FIG. 1, in which an InP substrate has an InGaAs absorption layer on one main surface and a SiN protective film on the other main surface.
FIG. 5B is a schematic view illustrating the method for manufacturing the light-receiving element illustrated in FIG. 1, in which the SiN protective film has been removed.
FIG. 5C is a schematic view illustrating a method for manufacturing the light-receiving element illustrated in FIG. 1, in which a type II multi-quantum well structure and an InP window layer are epitaxially grown after the SiN protective film was removed.
Figure 5:
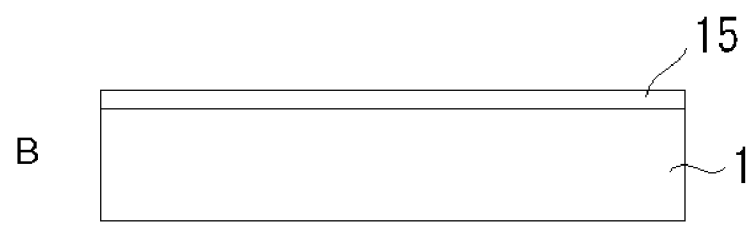
Figure 5:
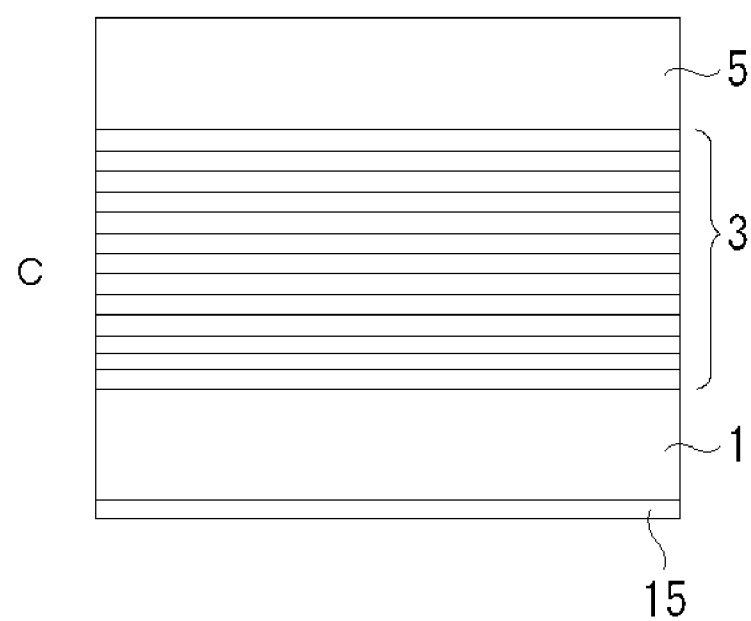

FIGS. 5A to 5C are explanatory views of a method for manufacturing the light-receiving element 10 illustrated in FIG. 1. As illustrated in FIG. 5A, a protective film 41, for example, made of SiN is formed on one main surface of the InP substrate 1, which is a double-sided mirror. The n-type InGaAs absorption layer 15 is epitaxially grown on the other main surface. One exemplary growth method is a metal-organic vapor phase epitaxy (MOVPE) method. As illustrated in FIG. 5B, the SiN protective film 41 on the main surface is then removed, for example, with hydrofluoric acid. An epitaxial layered body including the light-receiving layer 3 having a type II multi-quantum well structure is formed on the surface from which the SiN protective film 41 has been removed. The selective diffusion mask pattern 36 is formed on the InP window layer 5. The subsequent processes may be performed in accordance with a known manufacturing method.

Second Embodiment

Figure 6:
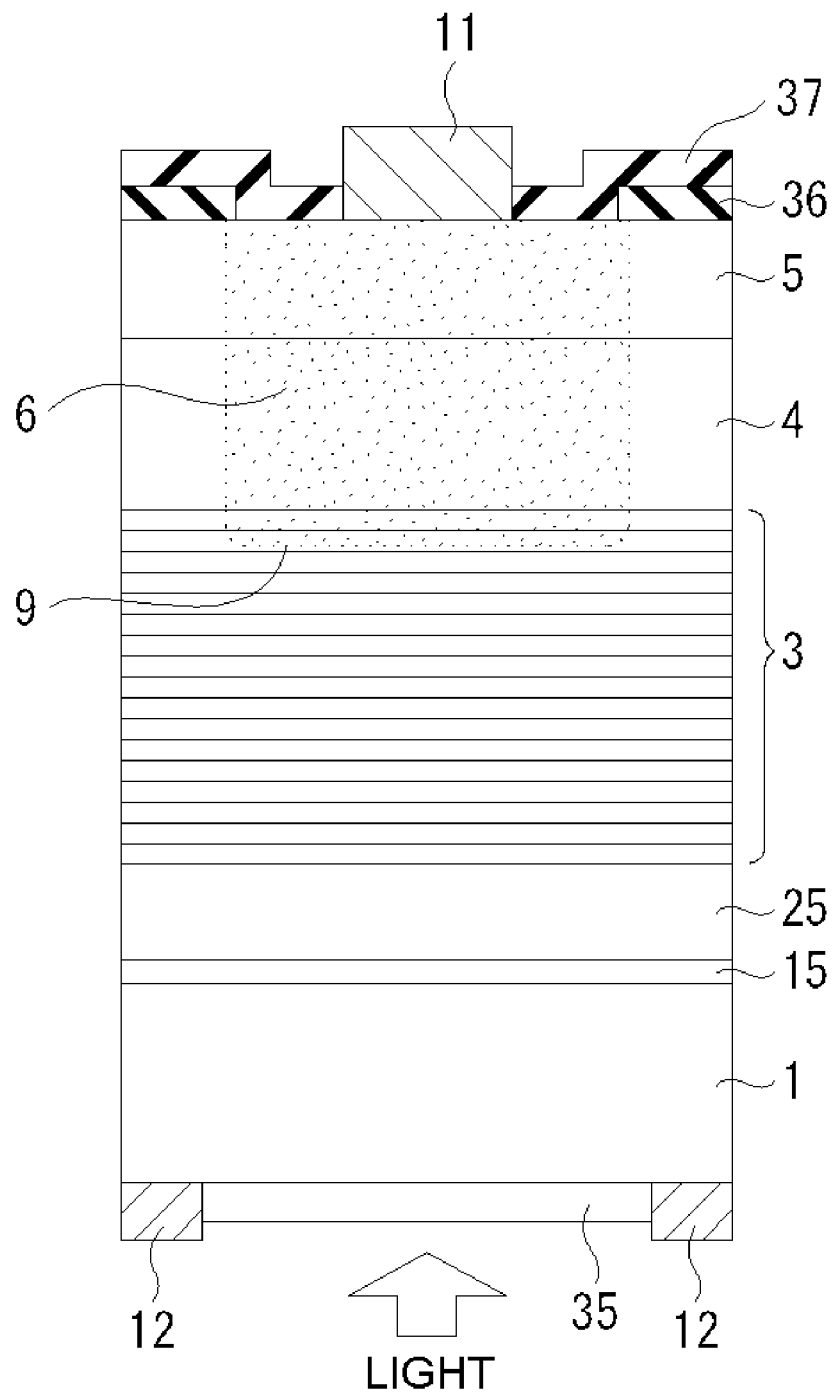
FIG. 6 is a schematic view of a light-receiving element according to a second embodiment of the present invention.

FIG. 6 is a schematic view of a light-receiving element 10 according to a second embodiment of the present invention. The light-receiving element 10 has the following layered structure of a III-V group compound semiconductor.

Sulfur (S)-doped n-type InP substrate 1/n-type InGaAs absorption layer 15/n-type hole-extinguishing layer 25/light-receiving layer 3 having type II (InGaAs/GaAsSb) multi-quantum well structure/InGaAs diffusion concentration distribution control layer 4/InP window layer 5

The light-receiving element 10 is different from the light-receiving element according to the first embodiment illustrated in FIG. 1 in the following points.

(1) The InGaAs absorption layer 15 is disposed on the light-receiving layer 3 side of the InP substrate 1.

(2) A hole-extinguishing layer 25 is disposed between the InGaAs absorption layer 15 and the light-receiving layer 3.

(3) An InGaAs diffusion concentration distribution control layer 4 is disposed between the InP window layer 5 and the type II multi-quantum well structure 3.

Since (1) the InGaAs absorption layer 15 is disposed on the light-receiving layer 3 side of the InP substrate 1, the InGaAs absorption layer 15 must be separated from the light-receiving layer 3 in order to prevent holes generated in the InGaAs absorption layer 15 from reaching the light-receiving layer 3. In the present embodiment, the hole-extinguishing layer 25 having a thickness of 50% or more of the hole diffusion length is disposed between the InGaAs absorption layer 15 and the light-receiving layer 3. Since the hole diffusion length is approximately 1.6 μm, the hole-extinguishing layer 25 may have a thickness of 0.8 μm or more. The hole-extinguishing layer 25 preferably has a thickness equal to or greater than the hole diffusion length in order to extinguish holes. In this case, the hole-extinguishing layer 25 has a thickness of 1.6 μm or more. The hole-extinguishing layer 25 is preferably made of InP or AlInAs in consideration of lattice matching.

The InGaAs diffusion concentration distribution control layer 4 can prevent an excessively high concentration of impurities from entering the light-receiving layer 3 having a multi-quantum well structure by selective diffusion. In the InGaAs diffusion concentration distribution control layer 4, the concentration of impurities sharply decreases from a high concentration region (on the InP window layer side) to a low concentration region (on the multi-quantum well structure side). Thus, the InGaAs diffusion concentration distribution control layer 4 roughly includes the high impurity concentration region, a region in which the impurity concentration sharply changes, and the low impurity concentration region. The low concentration region tends to have a high electrical resistance. However, since InGaAs has a lower band gap energy than InP, which is commonly used in a window layer, even when the impurity concentration is decreased, an increase in electrical resistance or a decrease in electrical conductivity can be suppressed. Thus, the decrease in response speed while a voltage is applied can be suppressed. The InGaAs diffusion concentration distribution control layer 4 may have a thickness of approximately 1.0 μm. The InGaAs diffusion concentration distribution control layer 4 may be omitted.

The material, thickness, and other characteristics of the other layers of the light-receiving element 10 according to the second embodiment may be the same as in the first embodiment.

Responsivity correction due to the absorption layer 15 shown in FIG. 2, transition in the light-receiving layer 3 having the type II multi-quantum well structure illustrated in FIG. 3, and the calculation of the thickness of the absorption layer based on FIG. 4 are also applied to the present embodiment. The manufacturing method illustrated in FIG. 5 in combination with a known method may also be used in the present embodiment with minor modifications.

Third Embodiment

Figure 7:
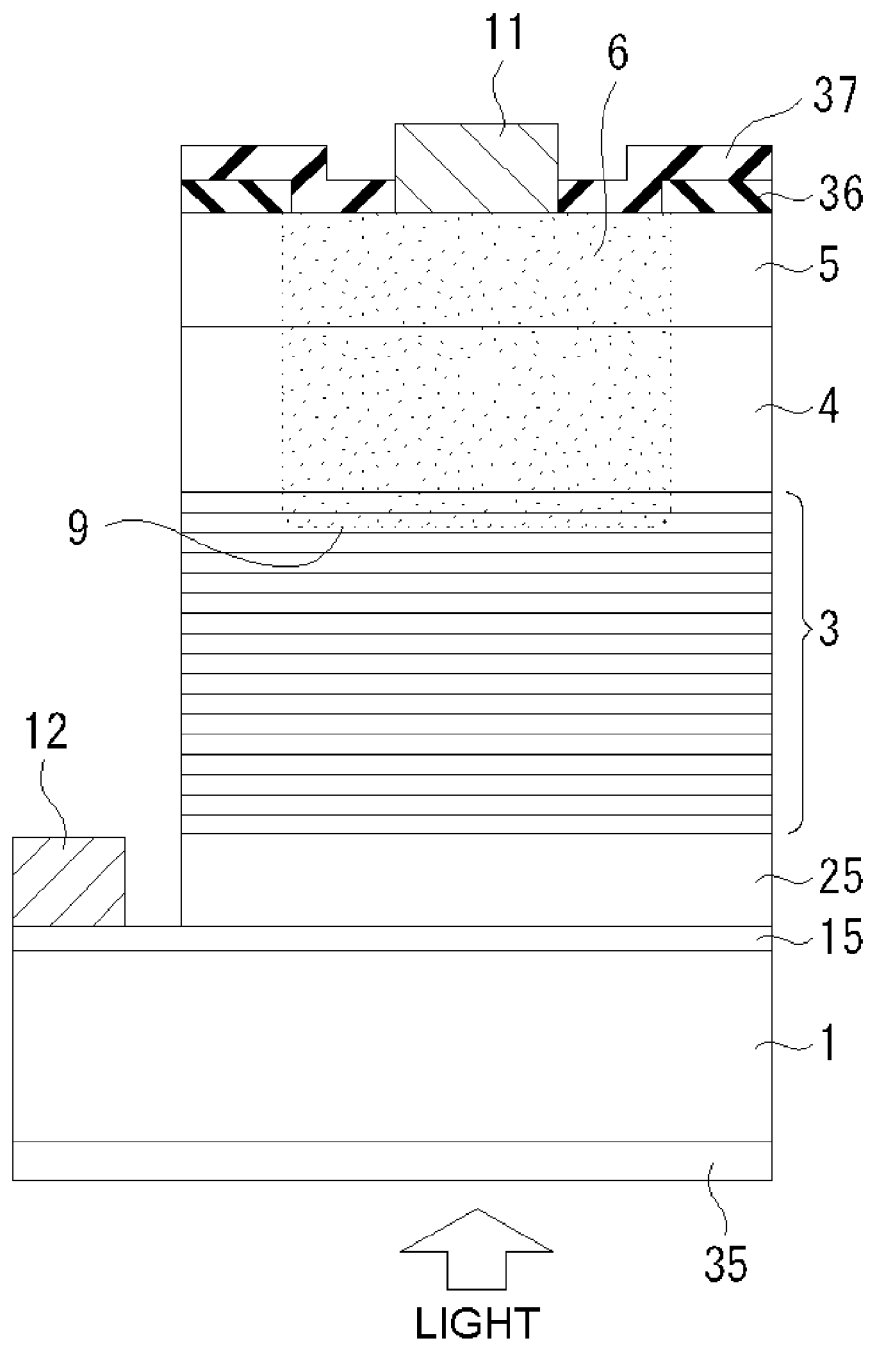
FIG. 7 is a schematic view of a light-receiving element according to a third embodiment of the present invention.

FIG. 7 is a schematic view of a light-receiving element 10 according to a third embodiment of the present invention. The light-receiving element 10 has the following layered structure of a III-V group compound semiconductor.

Iron (Fe)-doped semi-insulating InP substrate 1/n-type InGaAs absorption layer 15/n-type hole-extinguishing layer 25/light-receiving layer 3 having type II (InGaAs/GaAsSb) multi-quantum well structure/InGaAs diffusion concentration distribution control layer 4/InP window layer 5

Selective diffusion of zinc (Zn) under the top surface of the InP window layer 5 through an opening in a selective diffusion mask pattern 36 forms a p-type region 6 and a p-n junction 9 as defined above in front of the p-type region 6.

The light-receiving element 10 is different from the light-receiving element according to the second embodiment illustrated in FIG. 6 in the following points.

(1) The InP substrate 1 is an iron (Fe)-doped semi-insulating InP substrate. Except for the impurities, the InP substrate is also the (100) substrate.

(2) The negative electrode of the ground electrode 12 is disposed on the n-type InGaAs absorption layer 15.

(3) A side of the light-receiving element is mesa-etched to form a mesa structure.

The iron (Fe)-doped semi-insulating InP substrate 1 described in (1) has high transparency in a near-infrared region. Thus, the iron (Fe)-doped semi-insulating InP substrate 1 can generally improve responsivity in the near-infrared region. The reason for (2) is that the InP substrate is an Fe-doped semi-insulating InP substrate, and the negative electrode cannot be disposed on the back side of the Fe-doped InP substrate 1. Thus, the negative electrode is in ohmic contact with the n-type InGaAs absorption layer 15 having a high n-type impurity concentration. In order to realize the structure of (2), the mesa structure of (3) is utilized. The other major function of the mesa structure will be described below in the following fourth embodiment.

The material, thickness, and other characteristics of the other layers of the light-receiving element 10 according to the third embodiment may be the same as in the first or second embodiment.

Responsivity correction due to the absorption layer 15 shown in FIG. 2, transition in the light-receiving layer 3 having the type II multi-quantum well structure illustrated in FIG. 3, and the calculation of the thickness of the absorption layer based on FIG. 4 are also applied to the present embodiment. The manufacturing method may be a known method with appropriate modifications.

Fourth Embodiment

Figure 8:
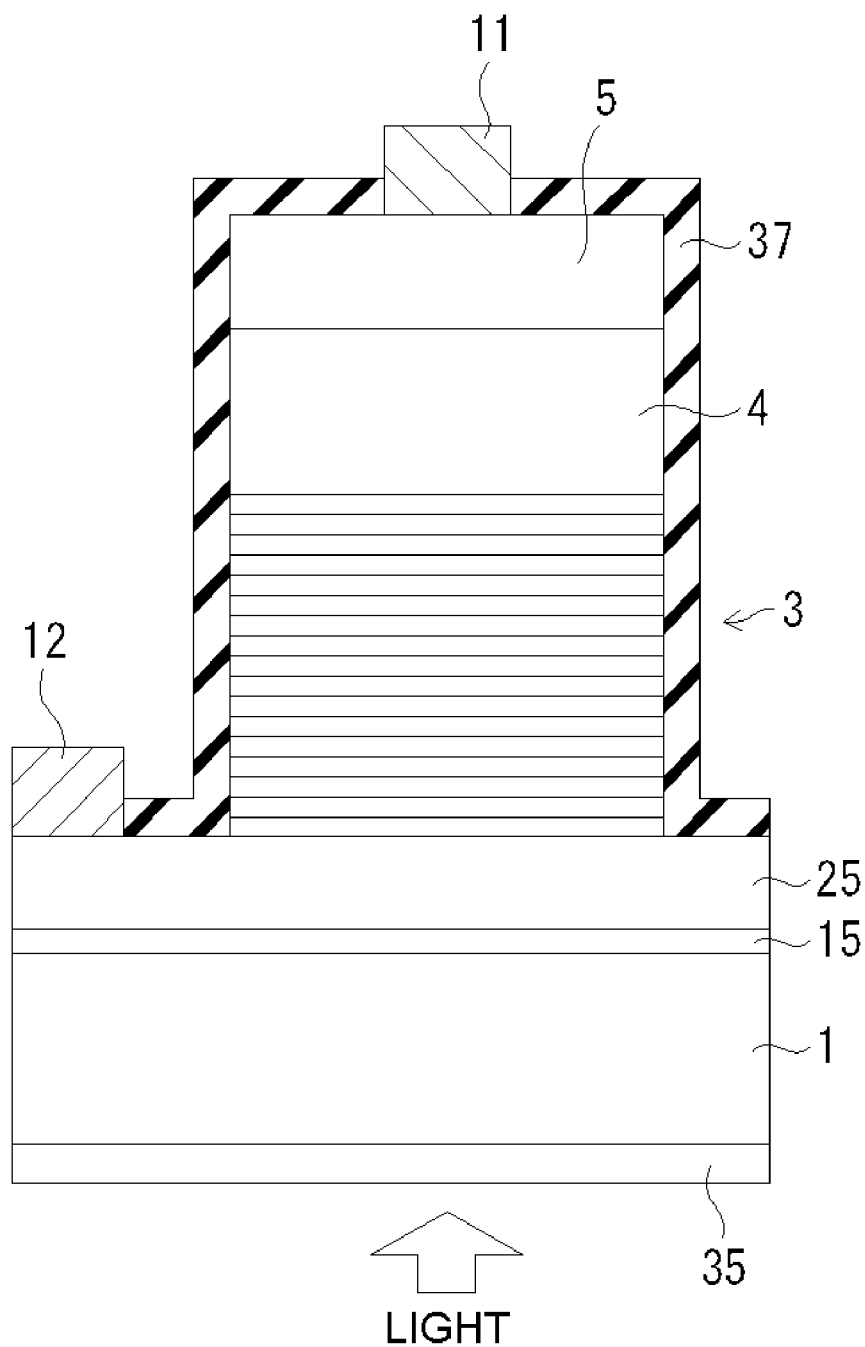
FIG. 8 is a schematic view of a light-receiving element according to a fourth embodiment of the present invention.

FIG. 8 is a schematic view of a light-receiving element 10 according to a fourth embodiment of the present invention. The light-receiving element 10 has the following layered structure of a III-V group compound semiconductor.

Iron (Fe)-doped semi-insulating InP substrate 1/InGaAs absorption layer 15/n-type hole-extinguishing layer 25/light-receiving layer 3 having type II (InGaAs/GaAsSb) multi-quantum well structure/p-type InGaAs intermediate layer 4/p-type InP window layer 5

Although a p-n junction is not illustrated in FIG. 8 for the sake of clarity, the light-receiving element 10 includes a p-n junction as defined above. In the present embodiment, however, the p-n junction is not formed by the formation of a p-type region by selective diffusion but is formed by impurity doping during epitaxial growth. The p-n junction is the p-n junction as defined above. The p-n junction therefore includes a p-i junction.

The p-type InGaAs intermediate layer 4 in FIG. 8 is doped so as to roughly include three regions: a high impurity concentration region (on the InP window layer side), a region in which the impurity concentration sharply changes, and a low impurity concentration region (on the multi-quantum well structure side). This can prevent a high concentration of impurities from diffusing into the light-receiving layer 3 having a multi-quantum well structure while a low band gap energy in InGaAs suppresses an increase in electrical resistance or a decrease in electrical conductivity.

In the present embodiment, a p-n junction in each pixel is formed by doping. Thus, the independence of each pixel must be secured by the mesa structure. As described in the beginning of the first embodiment, when the light-receiving element illustrated in FIG. 8 is considered to be one of one- or two-dimensionally arranged pixels, the mesa structure can increase the density of the pixel arrangement. The mesa structure can also improve manufacturing yields and reduce manufacturing costs as compared with selective diffusion.

The ground electrode 12 serving as a negative electrode is in ohmic contact with the n-type hole-extinguishing layer 25. Thus, the concentration of the n-type impurity is preferably as high as 5E18 cm$^{-3}$ or more. As in the third embodiment, the n-type hole-extinguishing layer 25 is made of InP or AlInAs and has a thickness of 0.8 μm or more, preferably 1.6 μm or more. Since the negative electrode is disposed on the n-type hole-extinguishing layer 25, the InGaAs absorption layer 15 may be undoped.

The material, thickness, and other characteristics of the other layers of the light-receiving element 10 according to the fourth embodiment may be the same as in the first or second embodiment.

Responsivity correction due to the absorption layer 15 shown in FIG. 2, transition in the light-receiving layer 3 having the type II multi-quantum well structure illustrated in FIG. 3, and the calculation of the thickness of the absorption layer based on FIG. 4 are also applied to the present embodiment. The manufacturing method may be a known method with appropriate modifications.

Fifth Embodiment

Figure 9A:
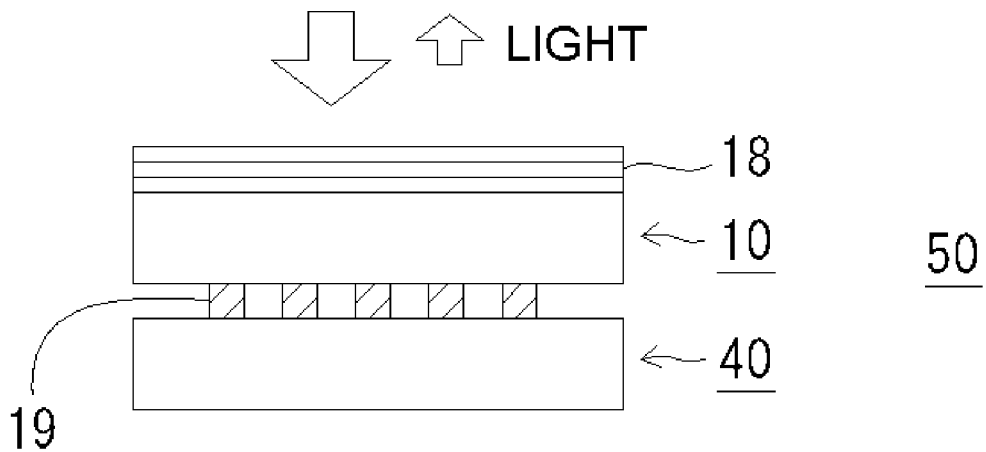
FIG. 9A is a schematic view of an optical device (such as an image pickup apparatus) including a light-receiving element according to a fifth embodiment of the present invention and a read-out integrated circuit.
Figure 9B:
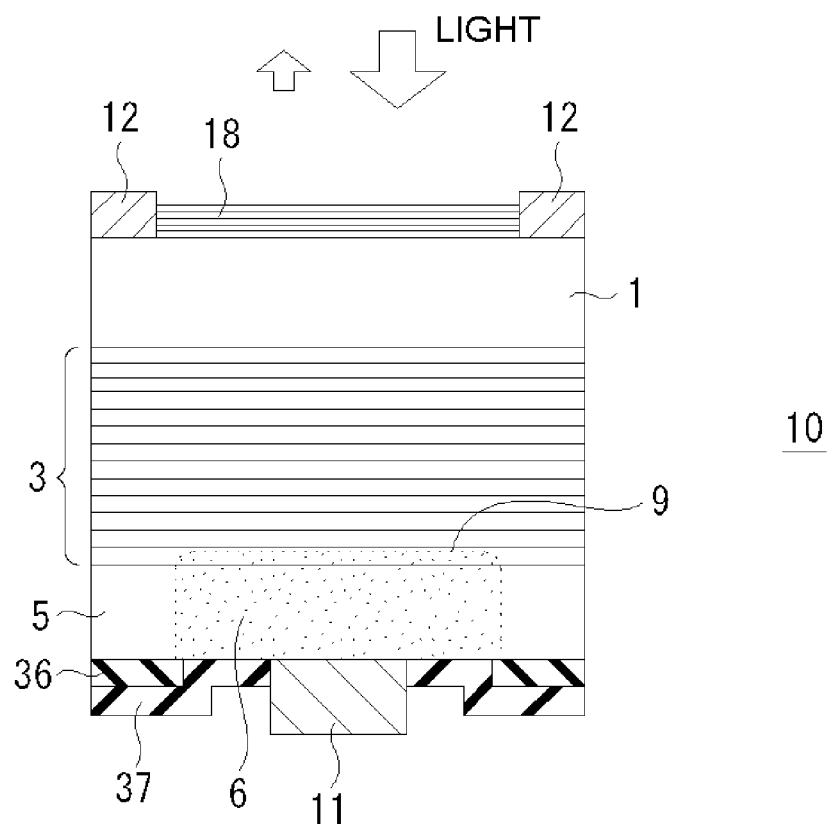
FIG. 9B is a schematic view of a single pixel of the light-receiving element according to the fifth embodiment of the present invention.

FIG. 9A is a schematic view of an optical device 50 (such as an image pickup apparatus) including a light-receiving element 10 according to a fifth embodiment of the present invention. A pixel electrode (not shown) of the light-receiving element 10 is electrically connected to a read-out electrode (not shown) of the read-out integrated circuit 40 through bumps 19. FIG. 9B is a schematic view of a single pixel of the light-receiving element 10. The following is an epitaxial layered structure of a III-V group compound semiconductor in the light-receiving element 10.

Sulfur (S)-doped n-type InP substrate 1/light-receiving layer 3 having (InGaAs/GaAsSb) type II multi-quantum well structure/InP window layer 5

The present embodiment is different from the other embodiments in that a dielectric multi-layer film 18, which is a coating film, is disposed on the back side of the S-doped n-type InP substrate 1. The dielectric multi-layer film 18 can reflect light, resulting in low transmittance, in the type I wavelength region and negligibly reflect light, resulting in high transmittance, in the longer wavelength region. The dielectric multi-layer film 18 disposed on the back side of the sulfur (S)-doped n-type InP substrate 1 can make responsivity uniform in a wavelength region in the range of 1.0 to 2.2 μm, as shown in FIG. 2.

Figure 10A:
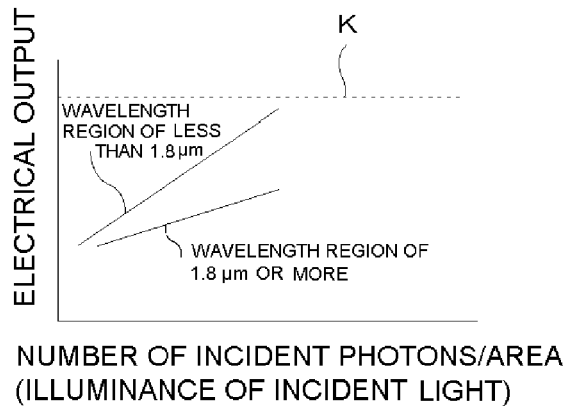
FIG. 10A shows the relationship between the illuminance of incident light and the electrical output of a read-out integrated circuit or the like, showing the advantages of the first to fifth embodiments of the present invention. Responsivity in a type I wavelength region (a wavelength region of less than 1.8 µm) is excessively higher than responsivity in a wavelength region of 1.8 µm or more.
Figure 10B:
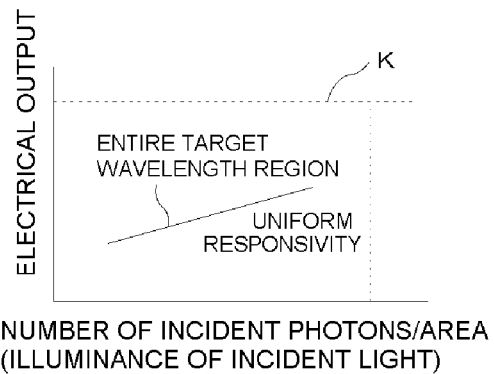
FIG. 10B is a graph of the relationship between the illuminance of incident light and the electrical output of a read-out integrated circuit or the like, showing the advantages of the first to fifth embodiments of the present invention. In each of the embodiments of the present invention, responsivity is made uniform throughout the target wavelength region.
Figure 10C:
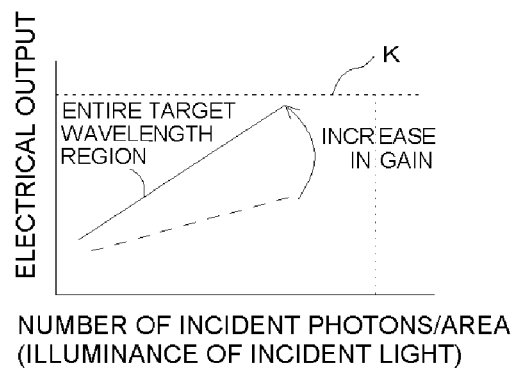
FIG. 10C is a graph of the relationship between the illuminance of incident light and the electrical output of a read-out integrated circuit or the like, showing the advantages of the first to fifth embodiments of the present invention. Room to increase gain has been utilized for the state illustrated in FIG. 10B.

The uniform responsivity in the optical device 50 including the read-out integrated circuit 40 illustrated in FIG. 9A makes room to increase gain relative to the electrical output saturation level of the read-out integrated circuit 40. FIGS. 10A to 10C are graphs of the relationship between the illuminance of incident light and the electrical output of a read-out integrated circuit or the like, showing the advantages of the embodiments of the present invention. The descriptions for FIGS. 10A, 10B, and 10C are not limited to the fifth embodiment and may be applied to the first to fourth embodiments. FIG. 10A illustrates the relationship between the illuminance of incident light and electrical output in a known light-receiving element, showing that responsivity in a type I wavelength region (a wavelength region of less than 1.8 μm) is excessively higher than responsivity in a wavelength region of 1.8 μm or more. In FIG. 10A, two straight lines indicate an increase in electrical output with increasing light illuminance in their respective wavelength regions. The presence of two straight lines is problematic in existing light-receiving elements. More specifically, the electrical output in the wavelength region of less than 1.8 μm is excessively high and is close to an electrical output saturation level K. In contrast, the electrical output in the wavelength region of 1.8 μm or more is much lower than the wavelength region of less than 1.8 μm and is far from the electrical output saturation level K. Since the electrical output in the wavelength region of less than 1.8 μm is close to the electrical output saturation level K, the electrical output in the wavelength region of 1.8 μm or more cannot be increased.

FIG. 10B illustrates the relationship between the illuminance of incident light and electrical output when illuminance in the wavelength region of less than 1.8 μm is reduced to make responsivity in the target wavelength region uniform, as in the present embodiment (the first to fourth embodiments are similar to the present embodiment). Because of no wavelength region having excessively high electrical output, there is room to increase the electrical output relative to the electrical output saturation level K. Thus, as illustrated in FIG. 10C, a control unit of the read-out integrated circuit 40 can increase the electrical output of signals read from the light-receiving element 10 throughout the target wavelength region, including the wavelength region of 1.8 μm or more, to improve responsivity.

An example of the dielectric multi-layer film 18 of the light-receiving element according to the fifth embodiment was manufactured. The dielectric multi-layer film 18 had the following features.

(1) Structure: back side of InP substrate 1/SiO$_2$ (thickness: 172.5 nm)/SiN (thickness: 603.2 nm)/SiO$_2$ (thickness: 34.6 nm)

(2) Manufacturing method: plasma chemical vapor deposition (CVD), substrate temperature 250° C.

Figure 11:
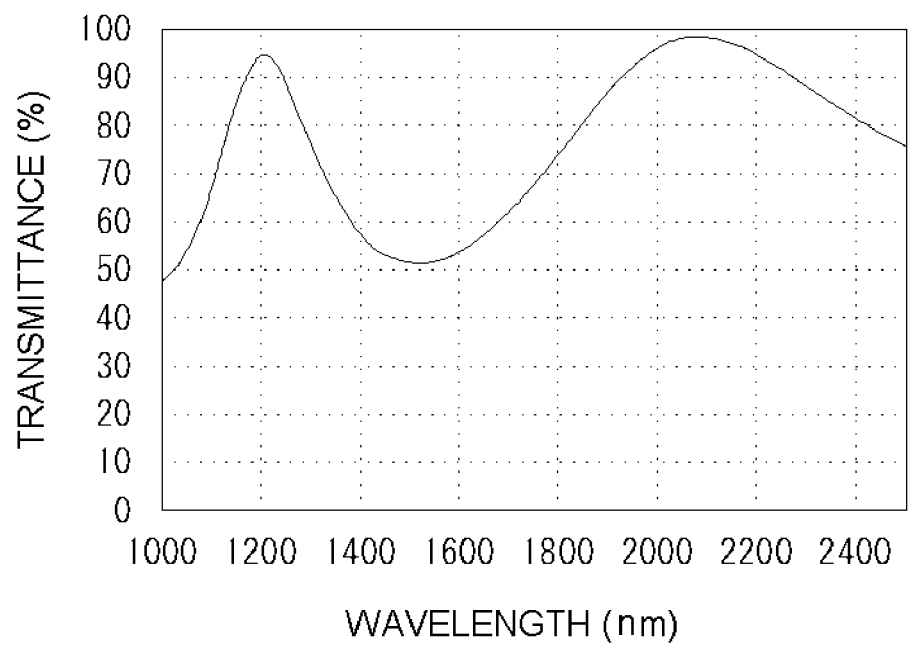
FIG. 11 is a graph illustrating the relationship between wavelength and the transmittance of light passing through a dielectric multi-layer film in the fifth embodiment.

(3) Performance (wavelength dependence of transmittance):

FIG. 11 is a graph illustrating the wavelength dependence of transmittance of light passing through a dielectric multi-layer film according to the fifth embodiment. As described above, the transmittance was 50% at a wavelength of 1.5 μm and 100% at a wavelength of 2.1 μm. The transmittance changed smoothly between these wavelengths. The shape of the transmittance-wavelength curve between these wavelengths can be altered by changing the structure of the dielectric multi-layer film 18. Thus, the wavelength dependence of responsivity can be made uniform, as shown in FIG. 2. Consequently, as illustrated in FIG. 10C, it is possible to improve gain throughout the target wavelength region, including the longer-wavelength region.

Another example of the dielectric multi-layer film 18 of the light-receiving element was manufactured. The dielectric multi-layer film 18 had the following features.

(1) Structure: back side of InP substrate 1/SiN (thickness: 394.5 nm)/SiO$_2$ (thickness: 238.6 nm)/SiN (thickness: 135.3 nm)

(2) Manufacturing method: plasma chemical vapor deposition (CVD), substrate temperature 250° C.

Figure 12:
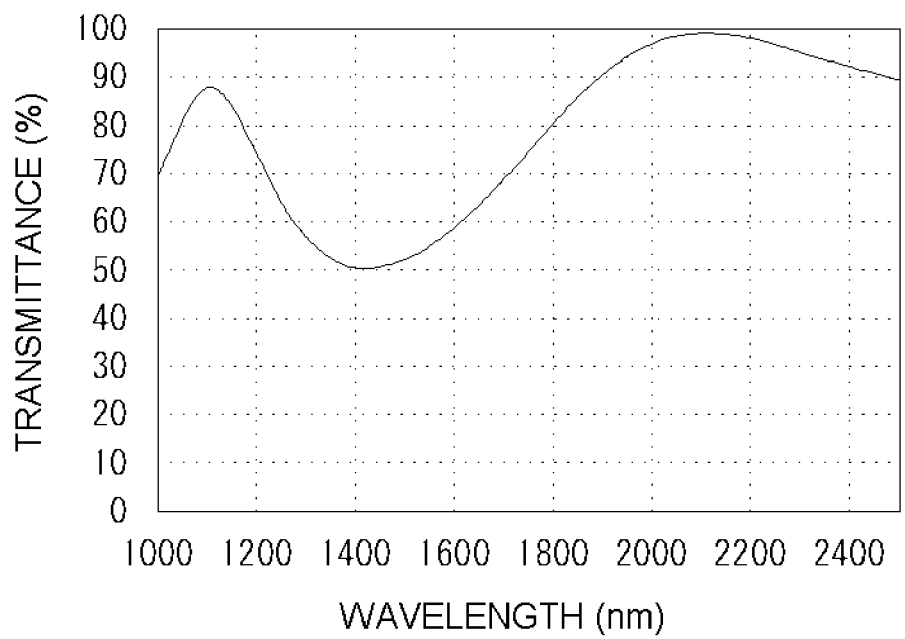
FIG. 12 is a graph illustrating the relationship between wavelength and the transmittance of light passing through another dielectric multi-layer film in the fifth embodiment.

(3) Performance (wavelength dependence of transmittance):

FIG. 12 is a graph illustrating the wavelength dependence of transmittance of light passing through another dielectric multi-layer film according to the fifth embodiment. The wavelength of the minimum transmittance shifted to a shorter wavelength of 1.4 µm. The minimum transmittance was 50%, which is substantially the same as in FIG. 11. The wavelength of the maximum transmittance was 2.1 µm, and the maximum transmittance was 100%. These are also the same as in FIG. 11. Like the dielectric multi-layer film 18 in FIG. 11, the wavelength dependence of responsivity can be made uniform, and it is possible to improve responsivity (gain) throughout the target wavelength region.

Although the embodiments and examples of the present invention are described above, these embodiments and examples are presented only for the purpose of illustration and do not limit the scope of the present invention. The scope of the present invention is defined by the appended claims and embraces all changes that fall within the scope of the claims and the equivalents thereof.

In accordance with the present invention, a light-receiving element including a light-receiving layer having a type II multi-quantum well structure for a near-infrared to infrared region has uniform responsivity throughout the target wavelength region and can be used in high-precision spectroscopic analysis.

What is claimed is:

1. A light-receiving element, comprising:
a III-V group compound semiconductor substrate having a principal surface and a back surface opposite to the principal surface;
a light-receiving layer having a type II multi-quantum well structure disposed on the principal surface of the substrate, the type II multi-quantum well structure including a first semiconductor layer and a second semiconductor layer stacked alternately, the first semiconductor layer having a lower conduction band energy than that of the second semiconductor layer, the second semiconductor layer having a higher valence band energy than that of the first semiconductor layer; and
a semiconductor absorption layer disposed on the back surface of the substrate,
wherein the type II multi-quantum well structure includes a first absorption peak wavelength due to a type II transition from a quantum level in the valence band of the second semiconductor layer to a quantum level in the conduction band of the first semiconductor layer and a second absorption peak wavelength due to a type I transition between the quantum levels of the valence band and conduction band in the first semiconductor layer or the second semiconductor layer, the second absorption peak wavelength being smaller than the first absorption peak wavelength, and the semiconductor absorption layer has an absorption peak wavelength substantially corresponding to the second absorption peak wavelength.

2. The light-receiving element according to claim 1, wherein the semiconductor absorption layer is separated from the light-receiving layer by 50% or more of the hole diffusion length.

3. The light-receiving element according to claim 1, wherein the semiconductor absorption layer is an InGaAs or InGaAsP layer.

4. A light-receiving element comprising:
a III-V group compound semiconductor substrate having a principal surface;
a semiconductor absorption layer disposed on the principal surface of the substrate;
a light-receiving layer having a type II multi-quantum well structure disposed on the semiconductor absorption layer, the type II multi-quantum well structure including a first semiconductor layer and a second semiconductor layer stacked alternately, the first semiconductor layer having a lower conduction band energy than that of the second semiconductor layer, the second semiconductor layer having a higher valence band energy than that of the first semiconductor layer; and
a hole-extinguishing layer between the semiconductor absorption layer and the light-receiving layer,
wherein the type II multi-quantum well structure includes a first absorption peak wavelength due to a type II transition from a quantum level in the valence band of the second semiconductor layer to a quantum level in the conduction band of the first semiconductor layer and a second absorption peak wavelength due to a type I transition between the quantum levels of the valence band and conduction band in the first semiconductor layer or the second semiconductor layer, the second absorption peak wavelength being smaller than the first absorption peak wavelength,
the semiconductor absorption layer has an absorption peak wavelength substantially corresponding to the second absorption peak wavelength, and
the hole-extinguishing layer has a thickness of 50% or more of the hole diffusion length and contains a III-V group compound semiconductor.

5. The light-receiving element according to claim 4, wherein the hole-extinguishing layer includes an InP layer and/or an AlInAs layer.

6. A light-receiving element comprising:
a III-V group compound semiconductor substrate having a principal surface and a back surface opposite to the principal surface;
a light-receiving layer having a type II multi-quantum well structure disposed on the principal surface of the substrate, the type II multi-quantum well structure including a first semiconductor layer and a second semiconductor layer stacked alternately, the first semiconductor layer having a lower conduction band energy than that of the second semiconductor layer, the second semiconductor layer having a higher valence band energy than that of the first semiconductor layer; and
a coating film disposed on the back surface of the substrate,
wherein the type II multi-quantum well structure includes a first absorption peak wavelength due to a type II transition from a quantum level in the valence band of the second semiconductor layer to a quantum level in the conduction band of the first semiconductor layer and a second absorption peak wavelength due to a type I transition between the quantum levels of the valence band and conduction band in the first semiconductor layer or the second semiconductor layer, the second absorption peak wavelength being smaller than the first absorption peak wavelength, and the coating film reflects light having a wavelength substantially corresponding to the second absorption peak wavelength.

7. The light-receiving element according to claim 6, wherein the coating film is a dielectric multi-layer film.

8. The light-receiving element according to claim 1, wherein the substrate is an InP substrate, and the light-receiving layer has a type II InGaAs/GaAsSb multi-quantum well structure or a type II GaInNAs/GaAsSb multi-quantum well structure.

9. The light-receiving element according to claim 4, wherein the substrate is an InP substrate, and the light-receiving layer has a type II InGaAs/GaAsSb multi-quantum well structure or a type II GaInNAs/GaAsSb multi-quantum well structure.

10. The light-receiving element according to claim 6, wherein the substrate is an InP substrate, and the light-receiving layer has a type II InGaAs/GaAsSb multi-quantum well structure or a type II GaInNAs/GaAsSb multi-quantum well structure.

11. The light-receiving element according to claim 9, further comprising a ground electrode in contact with the semiconductor absorption layer or the hole-extinguishing layer, wherein the InP substrate is doped with Fe or undoped.

12. The light-receiving element according to claim 8, wherein the light-receiving layer has a ratio A of responsivity at the first absorption peak wavelength to responsivity at the second absorption peak wavelength, the ratio A is less than 1, and the material and the thickness of the absorption layer are determined such that a ratio of light transmittance at the second absorption peak wavelength to light transmittance at the first absorption peak wavelength is 0.8 A or more and 1.2 A or less.

13. The light-receiving element according to claim 10, wherein the light-receiving layer has a ratio A of responsivity at the first absorption peak wavelength to responsivity at the second absorption peak wavelength, the ratio A is less than 1, and the material and the thickness of the coating film are determined such that a ratio of light transmittance at the second absorption peak wavelength to light transmittance at the first absorption peak wavelength is 0.8 A or more and 1.2 A or less.

14. The light-receiving element according to claim 12, wherein the second absorption peak wavelength is substantially 1.5 µm, and the first absorption peak wavelength is substantially 2.1 µm.

15. The light-receiving element according to claim 13, wherein the second absorption peak wavelength is substantially 1.5 µm, the first absorption peak wavelength is substantially 2.1 µm.

16. An optical device, comprising the light-receiving element according to claim 1.

17. The light-receiving element according to claim 1, wherein the absorption layer is made of substantially the same material as that of the first semiconductor layer or the second semiconductor layer.

* * * * *